(12) United States Patent  
Gardner (10) Patent No.: US 6,458,611 B1  
(45) Date of Patent: Oct. 1, 2002

(54) INTEGRATED CIRCUIT DEVICE CHARACTERIZATION

(75) Inventor: Donald S. Gardner, Mountain View, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/800,865

(22) Filed: Mar. 7, 2001

(51) Int. Cl.[7] .............................................. G01R 31/26

(52) U.S. Cl. ...................................................... 438/17

(58) Field of Search ........................ 438/17, 18, 5–15, 438/880; 716/4, 5–7

(56) References Cited

U.S. PATENT DOCUMENTS 5,434,094 A * 7/1995 Kobiki et al. ............... 438/167

* cited by examiner

*Primary Examiner*—Craig A Thompson  
(74) *Attorney, Agent, or Firm*—Blakely, Sokoloff, Taylor & Zafman LLP (57) ABSTRACT

One or more electrical characteristics of an integrated circuit device are measured at one or more relatively lower frequencies. One or more parameters of the integrated circuit device are measured at one or more frequencies higher than the one or more relatively lower frequencies. One or more parameters of the integrated circuit device are calculated based on the measured one or more electrical characteristics. The integrated circuit device is characterized based on the calculated one or more parameters and the measured one or more parameters.

21 Claims, 6 Drawing Sheets

INTEGRATED CIRCUIT DEVICE CHARACTERIZATION

BACKGROUND OF THE INVENTION

1. Field of the Invention

The present invention relates generally to the field of circuit characterization. More particularly, the present invention relates to the field of integrated circuit device characterization.

2. Description of Related Art

Integrated radio frequency (RF) circuit devices may be measured using network analyzers that typically operate from approximately 0.1 GigaHertz (GHz) to approximately 20 GHz. As the sensitivity of a typical network analyzer is limited to no less than several ohms of reactance, integrated circuit devices that are to operate at relatively low frequencies and/or with electrical characteristics having relatively low values may not be measured using network analyzers.

As one example, an integrated inductor that has an inductance below 100 nanoHenries (nH) and that is to operate at a frequency of approximately 3 MegaHertz (MHz) could not be measured by a typical network analyzer even if the network analyzer could be operated at a relatively lower frequency such as approximately 1 MHz, for example. As another example, inductors comprising a magnetic material such as a nickel iron (NiFe) permalloy, for example, cannot be measured by a typical network analyzer because such inductors can only be operated at relatively low frequencies below 100 MHz, for example. The magnetic material otherwise becomes lossy.

Characterizing an integrated RF circuit device such as an inductor, for example, at relatively high frequencies with a network analyzer is challenging. The cross-sectional area of the conductor for the inductor becomes reduced due to skin effects, thereby increasing the resistance of the inductor. Parasitic capacitances and resistances in the substrate of the integrated RF circuit device depend on the frequency at which the integrated RF circuit device operates. Also, parasitics exist in the cables and probes of the network analyzer.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for integrated circuit device characterization. In the following description, details are set forth such as a specific circuit model, measurement equipment, etc. in order to provide a thorough understanding of the present invention. It will be evident, however, that the present invention may be practiced without these details. In other instances, well-known algorithms, etc. have not been described in particular detail so as not to obscure the present invention.

Figure 1:
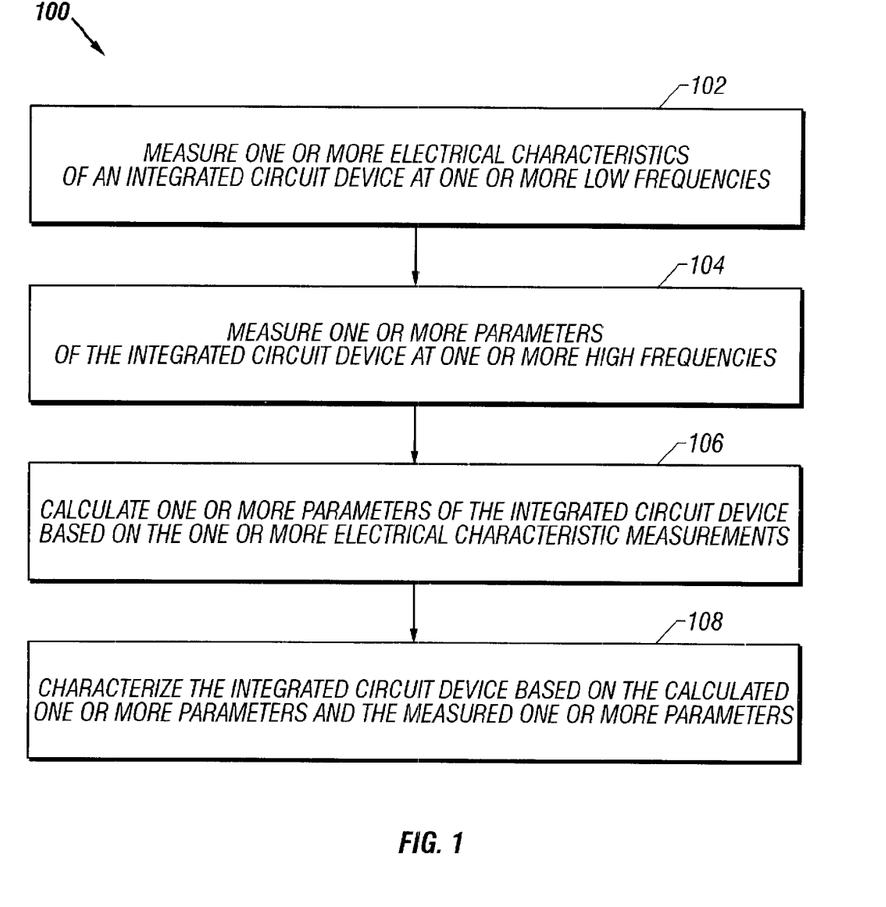
FIG. 1 illustrates, for one embodiment, a flow diagram to characterize an integrated circuit device.
Figure 2:
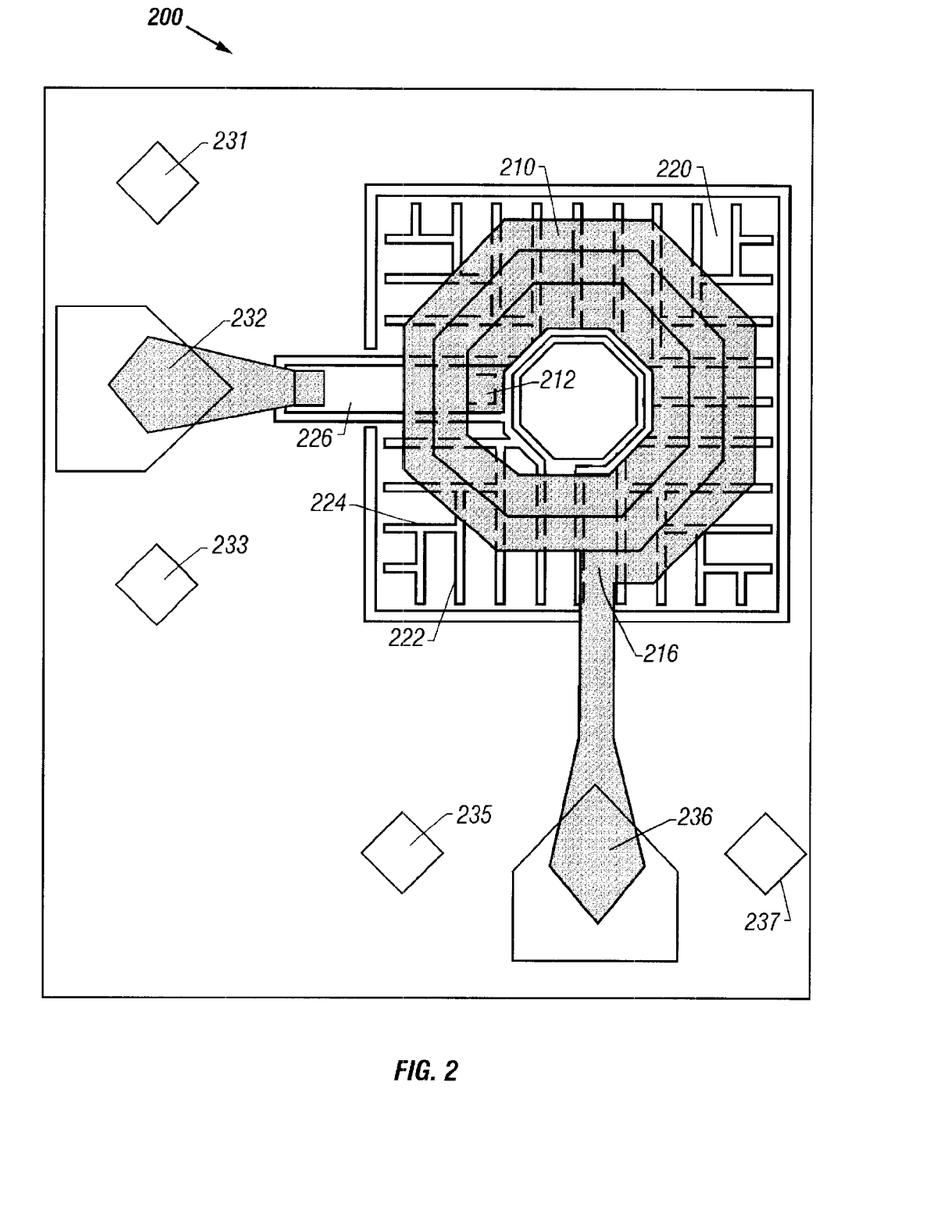
FIG. 2 illustrates, for one embodiment, an integrated inductor.

FIG. 1 illustrates, for one embodiment, a flow diagram 100 to characterize an integrated circuit device, such as an integrated inductor 200 as illustrated in FIG. 2. Although described in the context of integrated inductor 200, any suitable integrated circuit device including any other suitable integrated inductor may be characterized in accordance with flow diagram 100.

As illustrated in FIG. 2, integrated inductor 200 comprises a generally spiral-shaped conductor 210 defining a signal path along which current may flow to generate an electromagnetic field around conductor 210. Current may flow through conductor 210 by applying a voltage potential across an innermost node 212 near the beginning of the innermost turn of conductor 210 and an outermost node 216 near the end of the outermost turn of conductor 210. Node 212 is coupled to a pad 232 by a conductive underpass 226 that passes under each turn of conductor 210 and that is separated from conductor 210 by a dielectric layer. Node 216 is coupled to a pad 236. Integrated inductor 200 for one embodiment also comprises pads 231, 233, 235, and 237 each coupled to a ground node. Although described in the context of a ground node, the node coupled to each pad 231, 233, 235, and 237 may have any suitable voltage potential.

Integrated inductor 200 for one embodiment comprises an optional magnetic layer 220. Conductor 210 is positioned over magnetic layer 220 and is separated from magnetic layer 220 by at least a dielectric layer. Magnetic layer 220 forms a reference voltage plane for integrated inductor 200 to help contain electric and magnetic fields around conductor 210. Magnetic layer 220 for one embodiment is patterned to define conductive underpass 226.

Integrated inductor 200 for one embodiment is formed over a substrate comprising a semiconductor material with at least a dielectric layer separating magnetic layer 220 from the substrate. As conductor 210 generates a magnetic flux toward the substrate that would induce Eddy or mirror currents and noise in the substrate, positioning magnetic layer 220 between the substrate and conductor 210 helps reduce such currents and therefore helps reduce losses in integrated inductor 200 and minimizes concern for interference between integrated inductor 200 and neighboring circuitry. Magnetic layer 220 also helps prevent substrate coupling and helps reduce substrate dependency.

Integrated inductor 200 may be designed to have a suitable quality factor Q. The quality factor Q is proportional to $\omega L/R$, where $\omega$ is the operating frequency for integrated inductor 200, L is the inductance of integrated inductor 200, and R is the resistance of integrated inductor 200. As the quality factor Q of integrated inductor 200 is proportional to the inductance L of integrated inductor 200 and inversely proportional to the resistance R of integrated inductor 200, integrated inductor 200 can be designed with a relatively higher inductance L, and therefore a relatively higher quality factor Q, for a given area or resistance R of integrated inductor 200. Alternatively, for a given inductance L, integrated inductor 200 can be designed with a relatively smaller area and therefore a relatively lower resistance R and capacitance, resulting in a relatively higher resonance frequency $\omega_r$ and a relatively higher quality factor Q for integrated inductor 200.

Factors influencing the quality factor Q for integrated inductor 200 include the amount of area covered by conductor 210, the number of turns of conductor 210, the shape of each turn, the conductive material used for conductor 210, the width, thickness, and length of conductor 210, and the amount of spacing between turns for conductor 210.

Using magnetic layer 220 also helps influence the quality factor Q for integrated inductor 200. Magnetic layer 220 helps increase the inductance L of integrated inductor 200, and therefore the quality factor Q for integrated inductor 200. The magnetic material and thickness of magnetic layer 220 help determine the frequency at which integrated inductor 200 may be operated and the inductance L of integrated inductor 200. Magnetic layer 220 for one embodiment comprises a cobalt-zirconium-tantalum (CoZrTa) alloy that can operate in the GigaHertz (GHz) range. The dielectric material and thickness for the dielectric layer between conductor 210 and magnetic layer 220 help determine the capacitance and therefore the resonance frequency $\omega_r$ for integrated inductor 200. Defining optional slots in magnetic layer 220, such as slots 222 and 224 for example, helps reduce Eddy currents in magnetic layer 220 and helps increase the resonance frequency $\omega_r$ for integrated inductor 200.

Figure 3:
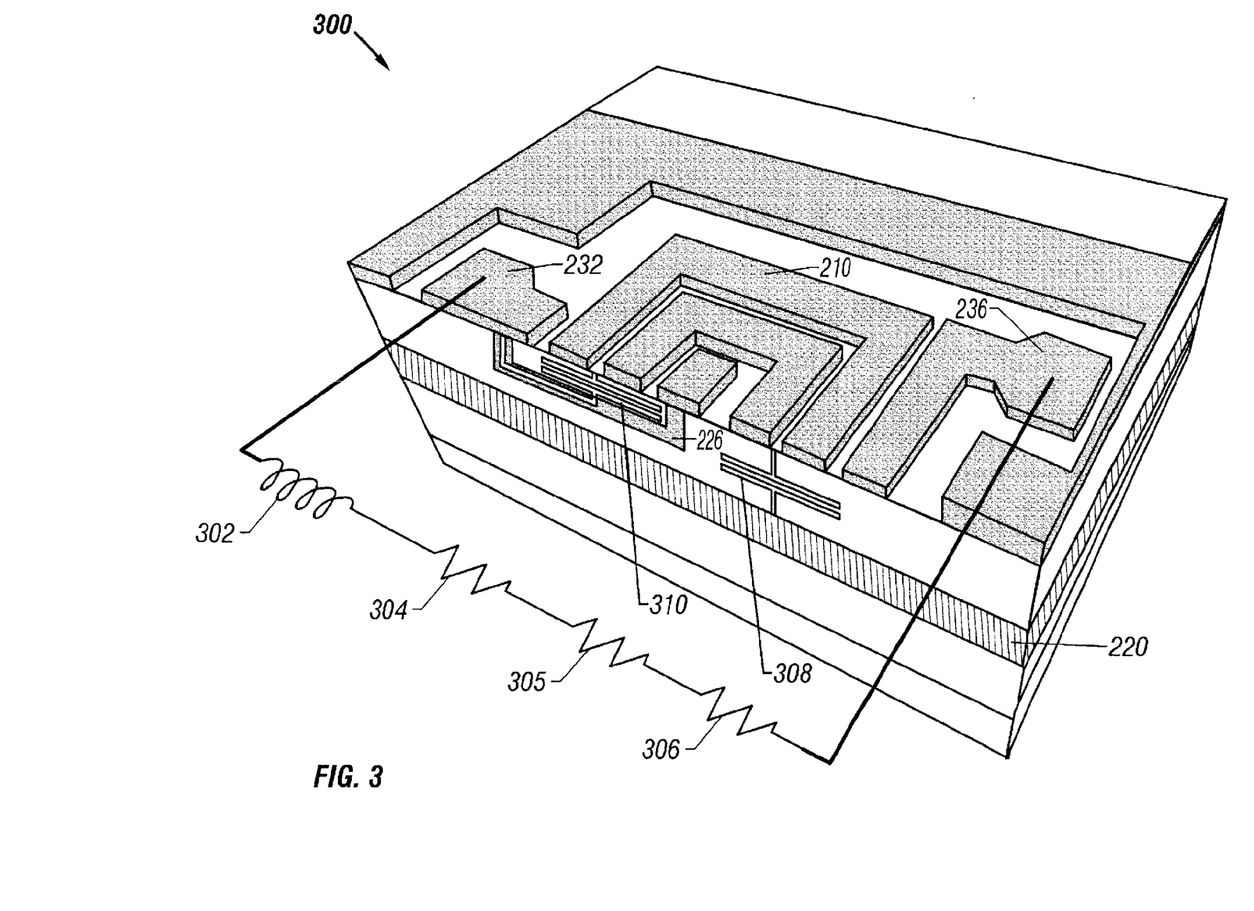
FIG. 3 illustrates, for one embodiment, an electrical model for the integrated inductor of FIG. 2.

FIG. 3 illustrates an exemplary electrical model 300 of integrated inductor 200. Electrical model 300 represents one or more electrical characteristics of integrated inductor 200 with corresponding ideal circuit elements and is used to help characterize integrated inductor 200. Electrical model 300 for one embodiment is an equivalent circuit model of integrated inductor 200.

Electrical model 300 for one embodiment comprises an inductor 302 representing the inductance L of the integrated inductor 200, a resistor 304 representing the resistance R of the integrated inductor 200, a resistor 305 representing a resistance $R_{se}$ caused by skin effect in integrated inductor 200, a resistor 306 representing a resistance $R_{Eddy}$ caused by Eddy current losses in magnetic layer 220 and the substrate, a capacitor 308 representing a capacitance $C_{c-m}$ between conductor 210 and magnetic layer 220, and a capacitor 310 representing a capacitance $C_{c-u}$ between conductor 210 and conductive underpass 226. Other equivalent circuit models mathematically related to electrical model 300 of FIG. 3 may be used for other embodiments.

Figure 4:
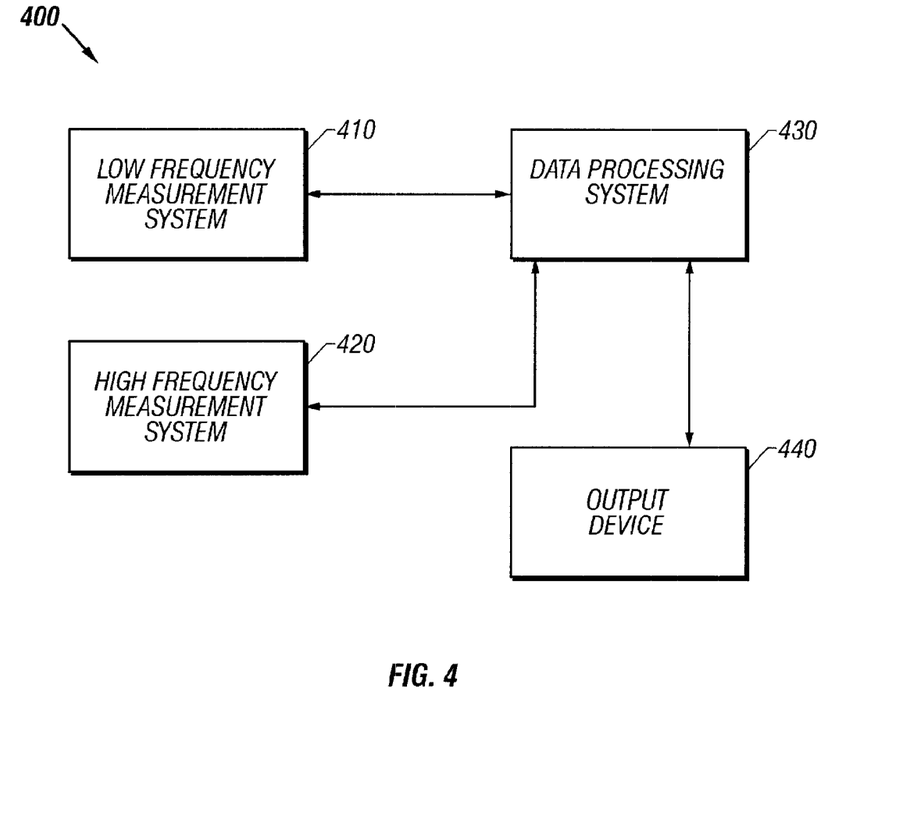
FIG. 4 illustrates, for one embodiment, a system to characterize an integrated circuit device.

The characterization of integrated inductor 200 in accordance with flow diagram 100 of FIG. 1 may be performed using any suitable equipment. For one embodiment, an integrated circuit device characterization system 400 as illustrated in FIG. 4 may be used to characterize an integrated circuit device. Integrated circuit device characterization system 400 for one embodiment comprises a low frequency measurement system 410, a high frequency measurement system 420, a data processing system 430, and an output device 440.

For block 102 of FIG. 1, one or more electrical characteristics of integrated inductor 200 are measured at one or more relatively lower frequencies. Any suitable electrical characteristics may be measured at any suitable one or more frequencies using any suitable measuring equipment. For one embodiment, electrical characteristics may be measured in the range from approximately 10 kiloHertz (kHz) to approximately 100 MegaHertz (MHz).

Figure 5:
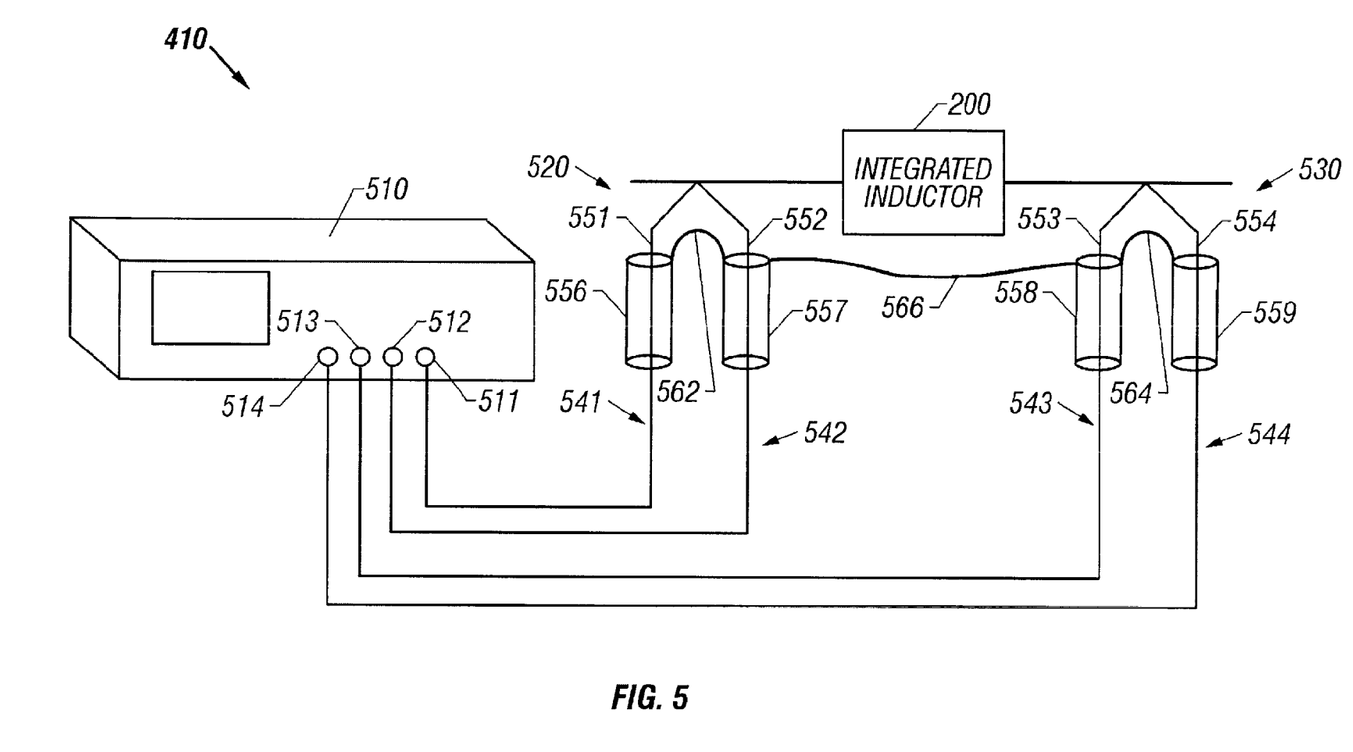
FIG. 5 illustrates, for one embodiment, a relatively lower frequency measurement system.

For one embodiment, low frequency measurement system 410 of FIG. 4 is used to measure one or more electrical characteristics of integrated inductor 200. Measurement system 410 for one embodiment, as illustrated in FIG. 5, comprises an impedance analyzer 510, a first probe 520, and a second probe 530. Impedance analyzer 510 for one embodiment is manufactured by Agilent Technologies, Inc. of Palo Alto, Calif. under model number 4294A and can measure electrical characteristics at frequencies ranging from approximately 40 Hertz (Hz) to approximately 110 MegaHertz (MHz). Probes 520 and 530 may each comprise any suitable probe. Each probe 520 and 530 for one embodiment comprises a Picoprobe® dual microwave probe manufactured by GGB Industries, Inc. of Naples, Fla.

Probes 520 and 530 for one embodiment are coupled to impedance analyzer 510 using a four-terminal configuration. A relatively high current terminal 511 and a relatively high voltage potential terminal 512 are coupled to probe 520 by respective lines 541 and 542. A relatively low voltage potential terminal 513 and a relatively low current terminal 514 are coupled to probe 530 by respective lines 543 and 544. Probe 520 may be conductively coupled to either pad 232 or 236, and probe 530 may be conductively coupled to the other pad 232 or 236 to measure one or more electrical characteristics of integrated inductor 200.

Lines 541, 542, 543, and 544 for one embodiment each comprise a coaxial cable each having an inner wire 551, 552, 553, and 554, respectively, surrounded by a shield 556, 557, 558, and 559, respectively. Inner wires 551 and 552 may be conductively coupled to either pad 232 or 236 and inner wires 553 and 554 may be conductively coupled to the other pad 232 or 236 to measure one or more electrical characteristics of integrated inductor 200.

Each shield 556, 557, 558, and 559 for one embodiment is driven by impedance analyzer 510 at a voltage that varies as a function of frequency to compensate for the impedance of the coaxial cables. Each shield 556, 557, 558, and 559 is then to remain electrically isolated from ground and from any body of corresponding probe 520 or 530. For one embodiment, shields 556, 557, 558, and 559 each extend to a location at or near the tip of corresponding probe 520 or 530. Shields 556, 557, 558, and 559 may then be conductively coupled to one another at or near integrated inductor 200 to help obtain increased measurement sensitivity. As one example, inductance values below one nanoHenry (nH) at frequencies in the MegaHertz range (MHz) may be measured.

Shields 556, 557, 558, and 559 may be conductively coupled to one another in any suitable manner. For one embodiment, shields 556 and 557 may be conductively coupled to one another at or near the end of each shield 556 and 557 using a foil jumper 562, for example, and shields 558 and 559 may be conductively coupled to one another at or near the end of each shield 558 and 559 using a foil jumper 564, for example. A foil jumper or braid 566 may be soldered at or near the end of each shield 557 and 558, for example, to conductively couple shields 556 and 557 to shields 558 and 559. Foil jumper or braid 566 for one embodiment may comprise two pieces, each soldered to a separate shield, that are then connected together after probes 520 and 530 are positioned to measure integrated inductor 200, for example.

Impedance analyzer 510 for one embodiment is calibrated with an open-short-load calibration technique across the tip of each probe 520 and 530. While impedance analyzer 510 is calibrated, shields 556, 557, 558, and 559 are to remain electrically isolated from any calibration substrate as impedance analyzer 510 may then drive a contacted portion of the calibration substrate. Any measurements made with impedance analyzer 510 may then be inaccurate. Shields 556, 557, 558, and 559 are similarly to remain electrically isolated from integrated inductor 200 while impedance analyzer 510 is used to measure integrated inductor 200.

Measurement system 410 for one embodiment is used to measure one or more circuit element values of electrical model 300 for integrated inductor 200. Values for inductor 302 and capacitor 308, for example, may be measured. As any increase resistance from skin effects and Eddy currents is minimal at relatively low frequencies, a value for resistor 304 may also be measured.

For block 104 of FIG. 1, one or more parameters of integrated inductor 200 are measured at one or more relatively high frequencies. Any suitable parameters may be measured at any suitable one or more frequencies using any suitable measuring equipment. For one embodiment, parameters may be measured in the range from approximately 30 MegaHertz (MHz) to approximately 20 GigaHertz (GHz).

Figure 6:
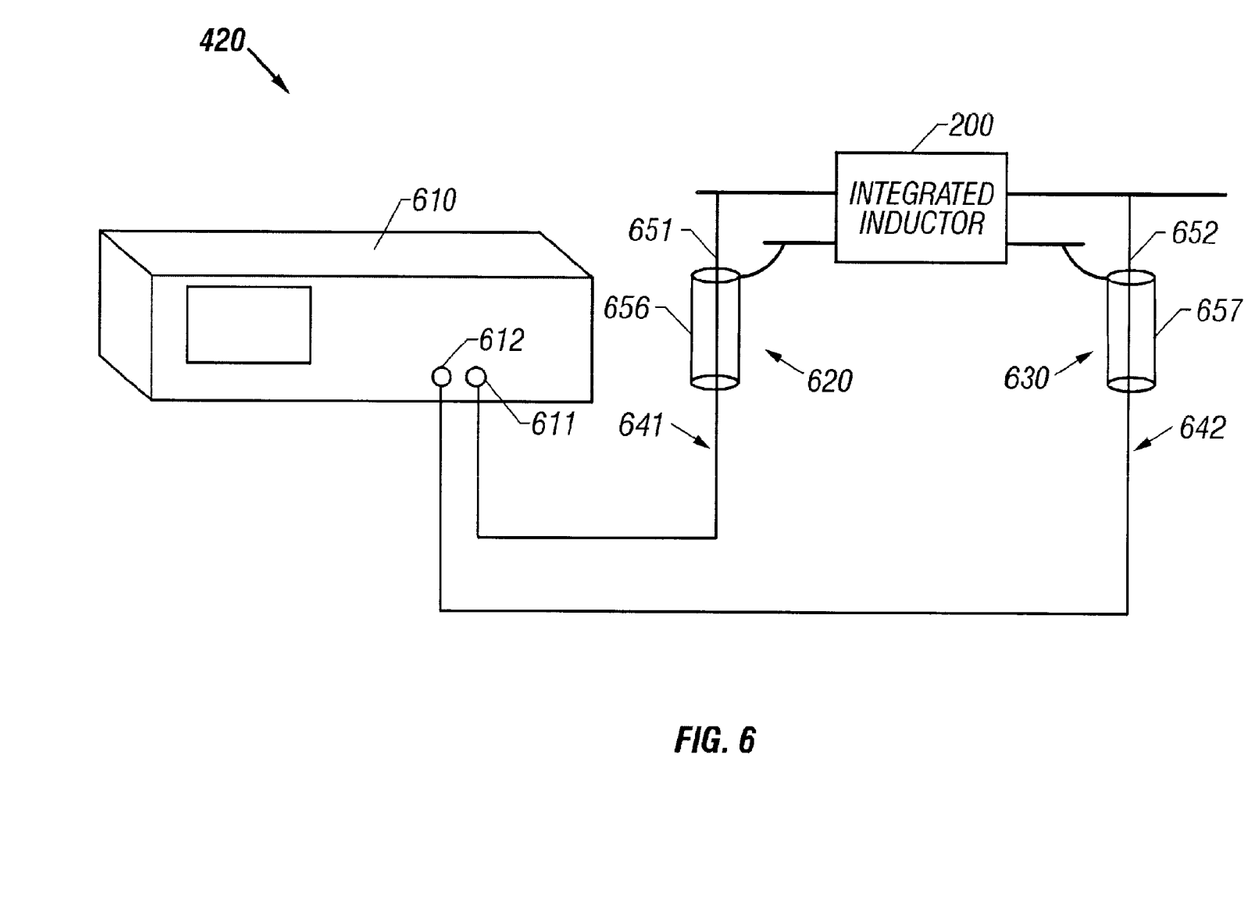
FIG. 6 illustrates, for one embodiment, a relatively higher frequency measurement system.

For one embodiment, high frequency measurement system 420 of FIG. 4 is used to measure one or more parameters of integrated inductor 200. Measurement system 420 for one embodiment, as illustrated in FIG. 6, comprises a network analyzer 610, a first probe 620, and a second probe 630. Network analyzer 610 for one embodiment is manufactured by Agilent Technologies, Inc. of Palo Alto, Calif. under model number 8720D and can measure parameters of integrated inductor 200 at frequencies ranging from approximately 0.05 GigaHertz (GHz) to approximately 20 GHz. Probes 620 and 630 may each comprise any suitable probe. Each probe 620 and 630 for one embodiment comprises a microwave probe manufactured by GGB Industries, Inc. of Naples, Fla. under model number 40A.

Network analyzer 610 for one embodiment measures integrated inductor 200 at a first port between pad 232 and pads 231 and/or 233 and at a second port between pad 236 and pads 235 and/or 237.

Probes 620 and 630 for one embodiment are coupled to network analyzer 610 using a two-terminal configuration. A terminal 611 is coupled to probe 620 by a line 641. A terminal 612 is coupled to probe 630 by a line 642. Probe 620 may be conductively coupled to either the first or second port of integrated inductor 200, and probe 630 may be conductively coupled to the other port of integrated inductor 200 to measure one or more parameters of integrated inductor 200. Probes 620 and 630 for one embodiment each has a ground-signal-ground (GSG) footprint to couple to pads 231–233 and pads 235–237. For another embodiment, each probe 620 and 630 may have a ground-signal (GS) footprint and use only one pad 231 or 233 with pad 232 and only one pad 235 or 237 with pad 236.

Lines 641 and 642 for one embodiment each comprise a coaxial cable each having an inner wire 651 and 652, respectively, surrounded by a shield 656 and 657, respectively. Inner wire 651 may be conductively coupled to either pad 232 or 236 and inner wire 652 may be conductively coupled to the other pad 232 or 236 to measure one or more parameters of integrated inductor 200. Shield 656 may be conductively coupled to pads 231 and/or 233 when inner wire 651 is to be conductively coupled to pad 232. Shield 656 may be conductively coupled to pads 235 and/or 237 when inner wire 651 is to be conductively coupled to pad 236. Shield 657 may be conductively coupled to pads 231 and/or 233 when inner wire 652 is to be conductively coupled to pad 232. Shield 657 may be conductively coupled to pads 235 and/or 237 when inner wire 652 is to be conductively coupled to pad 236.

Network analyzer 610 for one embodiment is calibrated with an open-short-load calibration technique between the signal tip and ground node for each probe 620 and 630 and with a through calibration technique across the signal tips and ground nodes for each probe 620 and 630.

For one embodiment, scattering parameters (s-parameters) of integrated inductor 200 may be measured. S-parameters are power wave descriptors that allow the input-output relations of a network to be defined in terms of incident, transmitted, and reflected power waves. Sparameters may therefore be used to describe how a circuit behaves.

Power waves can be fed into and taken from each port of integrated inductor 200. An incident power wave applied to one port can be partially reflected by integrated inductor 200 to form a reflected power wave at that port and partially transmitted through integrated inductor 200 to form a transmitted power wave at the other port.

The incident normalized power waves for the first and second ports may be represented by complex quantities $a_1$ and $a_2$, respectively, and the transmitted or reflected normalized power waves for the first and second ports may be represented by complex quantities $b_1$ and $b_2$, respectively. The transmitted or reflected waves may be expressed in terms of the incident waves by the matrix equation $B=S \times A$, where B is a vector containing $b_1$ and $b_2$, A is a vector containing $a_1$ and $a_2$, and S is a 2×2 square matrix of s-parameters $s_{11}$, $s_{12}$, $s_{21}$, and $s_{22}$.

The s-parameters $s_{11}$, $s_{12}$, $s_{21}$, and $s_{22}$ for integrated inductor 200 therefore satisy the following equations:

$$b_1 = s_{11} \times a_1 + s_{12} \times a_2$$

$$b_2 = s_{21} \times a_1 + s_{22} \times a_2$$

$$a_1 = (V_1 + Z_0 \times I_1)/(2 \times Z_0^{1/2})$$

$$a_2 = (V_2 + Z_0 \times I_2)/(2 \times Z_0^{1/2})$$

$$b_1 = (V_1 - Z_0 \times I_1)/(2 \times Z_0^{1/2})$$

$$b_2 = (V_2 - Z_0 \times I_2)/(2 \times Z_0^{1/2})$$

where $V_1$ represents a voltage at the first port of integrated inductor 200, $I_1$ represents a current at the first port of integrated inductor 200, $V_2$ represents a voltage at the second port of integrated inductor 200, $I_2$ represents a current at the second port of integrated inductor 200, and $Z_0$ represents the characteristic impedance of the connecting lines at the first and second ports of integrated inductor 200.

Each s-parameter $s_{11}$, $s_{12}$, $s_{21}$, and $s_{22}$ is frequency-dependent and has a real and imaginary part. They can also be converted to a magnitude and phase angle.

Where no power waves are applied to the second port, that is when $a_2=0$, the power wave incident to the first port, that is $a_1$, may be partially reflected from the first port as reflected power wave $b_1 = s_{11 \times a1}$ and partially transmitted out of the second port as transmitted power wave $b_2 = s_{21} \times a_1$. S-parameter $s_{11}$ then represents the ratio of the reflected power wave at the first port to the incident power wave at the first port when $a_2=0$, and s-parameter $s_{21}$ then represents the ratio of the transmitted power wave at the second port to the incident power wave at the first port when $a_2=0$.

Where no power waves are applied to the first port, that is when $a_1=0$, the power wave incident to the second port, that is $a_2$, may be partially transmitted out of the first port as transmitted power wave $b_1 = s_{12} \times a_2$ and partially reflected from the second port as reflected power wave $b_2 = s_{22} \times a_2$. S-parameter $s_{12}$ then represents the ratio of the transmitted power wave at the first port to the incident power wave at the second port when $a_1=0$, and s-parameter $s_{22}$ then represents the ratio of the reflected power wave at the second port to the incident power wave at the second port when $a_1=0$.

The conditions $a_1=0$ and $a_2=0$ imply that no power waves are applied at the first port and the second port, respectively, of integrated inductor 200. For one embodiment, the connecting transmission lines for the first and second ports are terminated into their characteristic impedances to ensure the conditions $a_1=0$ and $a_2=0$, respectively, are satisfied.

S-parameters $s_{11}$ and $s_{21}$ may be measured, for example, by measuring voltage and current values at the first and second ports of integrated inductor 200 while a power wave is applied to the first port, no power waves are applied to the second port, and the second port is terminated into the lines' characteristic impedance. S-parameters $s_{12}$ and $s_{22}$ may be measured, for example, by measuring voltage and current values at the first and second ports of integrated inductor 200 while a power wave is applied to the second port, no power waves are applied to the first port, and the first port is terminated into the lines' characteristic impedance.

Although described as measuring one or more parameters at two ports of integrated inductor 200, one or more parameters may be measured at another suitable number of one or more ports of the integrated circuit device to be characterized. As one example, each probe 620 and 630 for another embodiment may have only a signal footprint to measure scattering parameters of integrated inductor 200 at pads 232 and 236.

For block 106 of FIG. 1, one or more parameters of integrated inductor 200 are calculated based on the one or more electrical characteristic measurements. Any suitable parameters may be calculated based on the one or more electrical characteristic measurements using any suitable data processing system.

For one embodiment, data processing system 430 of FIG. 4 is used to calculate one or more parameters of integrated inductor 200 based on the one or more electrical characteristic measurements. Data processing system 430 may comprise any suitable circuitry and/or devices including, for example, one or more processors to execute instructions to process data, main memory to store instructions and data that may be readily accessed by a processor, and a non-volatile memory to store software and data.

For one embodiment, low frequency measurement system 410 transmits the one or more electrical characteristic measurements to data processing system 430 over a suitable communication medium. The one or more electrical characteristic measurements for other embodiments may be manually entered into data processing system 430 or read by data processing system 430 from a suitable memory device, for example.

For one embodiment, scattering parameters (s-parameters) of integrated inductor 200 may be calculated. For one embodiment, the s-parameters $s_{11}$, $s_{12}$, $s_{21}$, and $s_{22}$ for integrated inductor 200 may be calculated based on the one or more measured circuit element values for electrical model 300. Values for resistor 304 and capacitor 308, for example, have been measured for block 102. An initial value for inductor 302, for example, has also been measured for block 102. An initial value for capacitor 310 may be theoretically calculated, for example, based on the amount of area conductive underpass 226 overlaps conductor 210, the dielectric material between conductor 210 and conductive underpass 226, and the thickness of the dielectric material between conductor 210 and conductive underpass 226. Initial values for resistor 305 and 306 may be estimated. With initial values determined for each circuit element of electrical model 300, s-parameters $s_{11}$, $s_{12}$, $s_{21}$, and $s_{22}$ for integrated inductor 200 may be calculated based on the predictable behavior of electrical model 300.

For block 108 of FIG. 1, integrated inductor 200 is characterized based on the calculated one or more parameters and the measured one or more parameters. Integrated inductor 200 may be characterized in any suitable manner using any suitable data processing system.

For one embodiment, data processing system 430 of FIG. 4 is used to characterize integrated inductor 200 based on the calculated one or more parameters and the measured one or more parameters.

For one embodiment, high frequency measurement system 420 transmits the measured one or more parameters to data processing system 430 over a suitable communication medium. The one or more measured parameters for other embodiments may be manually entered into data processing system 430 or read by data processing system 430 from a suitable memory device, for example.

For one embodiment, the calculated one or more parameters are compared to the measured one or more parameters and one or more values for electrical model 300 are adjusted to help better fit the calculated one or more parameters to the measured one or more parameters. The one or more parameters are then recalculated based on the updated electrical model 300 and again compared to the measured one or more parameters. One or more values for electrical model 300 are iteratively adjusted in this manner until the calculated one or more parameters and the measured one or more parameters satisfy a predetermined condition. For one embodiment, one or more values for electrical model 300 are iteratively adjusted in this manner until a best fit is obtained.

For one embodiment, the values for resistor 304 and capacitor 308 remain fixed through the iterative updating of electrical model 300 as these values are substantially independent of frequency. The values of inductor 302, resistor 305, and resistor 306 are frequency dependent. The values of inductor 302, resistor 305, resistor 306, and/or capacitor 310 may each be iteratively adjusted within an estimated predetermined range of values.

For one embodiment where the calculated and measured parameters are s-parameters, one or more values for electrical model 300 are iteratively adjusted such that the magnitude and phase angles of the ratios of each calculated s-parameter match those of the corresponding measured s-parameter. For another embodiment, one or more values for electrical model 300 are adjusted such that the magnitude of the normalized differences between the calculated s-parameters and the measured s-parameters are minimized.

The values for electrical model 300 obtained by fitting the calculated one or more parameters to the measured one or more parameters may be used to determine the quality factor Q, parasitic resistances and capacitances, and the inductance L of integrated inductor 200 as a function of frequency. The resonance frequency $\omega_r$ for integrated inductor 200 may also be determined.

Integrated inductor 200 may therefore be characterized for block 108 by the updated electrical model 300, by any one or more determined electrical characteristics for integrated inductor 200, and/or by the calculated one or more parameters based on the updated electrical model 300.

Although described in the context of scattering parameters, other suitable parameters such as open circuit impedance parameters (z-parameters) or short circuit admittance parameters (y-parameters) for example, may also be used. Any parameters measured for block 104 and/or calculated for blocks 106 and 108 may be converted into any other suitable parameters in iteratively analyzing and updating electrical model 300.

Data processing system 430 for one embodiment outputs a characterization of integrated inductor 200 to output device 440 for analysis by a user. Output device 440 may comprise a display or printer, for example. Any suitable characterization of integrated inductor 200 as determined by data processing system 430 may be output to output device 440 for display or presentation in any suitable manner.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   (a) measuring one or more electrical characteristics of an integrated circuit device at one or more relatively lower frequencies;
   (b) measuring one or more parameters of the integrated circuit device at one or more frequencies higher than the one or more relatively lower frequencies;
   (c) calculating one or more parameters of the integrated circuit device based on the measured one or more electrical characteristics; and
   (d) characterizing the integrated circuit device based on the calculated one or more parameters and the measured one or more parameters.

2. The method of claim 1, wherein the measuring (a) comprises measuring one or more electrical characteristics using an impedance analyzer.

3. The method of claim 2, wherein the measuring (a) comprises driving a shield of each of a plurality of probe lines to compensate for impedance of the probe lines.

4. The method of claim 3, comprising electrically isolating each shield.

5. The method of claim 3, wherein the measuring (a) comprises conductively coupling each shield to one another at or near the integrated circuit device.

6. The method of claim 5, wherein the conductively coupling comprises coupling each shield to one another at or near an end of each shield with a foil jumper.

7. The method of claim 1, wherein the measuring (a) comprises measuring a value for one or more circuit elements of an electrical model of the integrated circuit device.

8. The method of claim 1, wherein the measuring (b) comprises measuring one or more parameters using a network analyzer.

9. The method of claim 7, wherein the calculating (c) comprises calculating one or more parameters based on the measured value for one or more circuit elements of the electrical model.

10. The method of claim 1, wherein the measuring (b) comprises measuring scattering parameters of the integrated circuit device; and
    wherein the calculating (c) comprises calculating scattering parameters of the integrated circuit device.

11. The method of claim 1, wherein the characterizing (d) comprises comparing the calculated one or more parameters to the measured one or more parameters and updating one or more values for an electrical model of the integrated circuit device.

12. The method of claim 1, wherein the characterizing (d) comprises iteratively comparing the calculated one or more parameters to the measured one or more parameters, updating one or more values for an electrical model of the integrated circuit device, and recalculating one or more parameters of the integrated circuit device based on the updated one or more values for the electrical model until the recalculated one or more parameters and the measured one or more parameters satisfy a predetermined condition.

13. A method comprising:
    (a) measuring a value for one or more circuit elements of an electrical model of an integrated circuit device at one or more relatively lower frequencies;
    (b) measuring one or more parameters of the integrated circuit device at one or more frequencies higher than the one or more relatively lower frequencies;
    (c) calculating one or more parameters of the integrated circuit device based on the measured value for one or more circuit elements of the electrical model;
    (d) comparing the calculated one or more parameters to the measured one or more parameters; and
    (e) updating one or more values for the electrical model of the integrated circuit device.

14. The method of claim 13, wherein the measuring (a) comprises measuring one or more values using an impedance analyzer.

15. The method of claim 14, wherein the measuring (a) comprises driving a shield of each of a plurality of probe lines to compensate for impedance of the probe lines.

16. The method of claim 15, comprising electrically isolating each shield.

17. The method of claim 15, wherein the measuring (a) comprises conductively coupling each shield to one another at or near the integrated circuit device.

18. The method of claim 17, wherein the conductively coupling comprises coupling each shield to one another at or near an end of each shield with a foil jumper.

19. The method of claim 13, wherein the measuring (b) comprises measuring one or more parameters using a network analyzer.

20. The method of claim 13, wherein the measuring (b) comprises measuring scattering parameters of the integrated circuit device; and
    wherein the calculating (c) comprises calculating scattering parameters of the integrated circuit device.

21. The method of claim 13, comprising iteratively comparing the calculated one or more parameters to the measured one or more parameters, updating one or more values for the electrical model of the integrated circuit device, and recalculating one or more parameters of the integrated circuit device based on the updated one or more values for the electrical model until the recalculated one or more parameters and the measured one or more parameters satisfy a predetermined condition.

* * * * *